(12) United States Patent
Laurent et al.

(10) Patent No.: US 12,266,410 B2
(45) Date of Patent: Apr. 1, 2025

(54) METHODS AND SYSTEMS FOR IMPROVING ECC OPERATION OF MEMORIES

(71) Applicant: Micron Technology, Inc., Boise, ID (US)

(72) Inventors: Christophe Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/801,467

(22) PCT Filed: Mar. 2, 2021

(86) PCT No.: PCT/IB2021/020008
§ 371 (c)(1),
(2) Date: Aug. 22, 2022

(87) PCT Pub. No.: WO2022/185088
PCT Pub. Date: Sep. 9, 2022

(65) Prior Publication Data
US 2024/0194284 A1 Jun. 13, 2024

(51) Int. Cl.
*G11C 29/42* (2006.01)
*G11C 29/12* (2006.01)
*G11C 29/52* (2006.01)

(52) U.S. Cl.
CPC .......... *G11C 29/42* (2013.01); *G11C 29/1201* (2013.01); *G11C 29/52* (2013.01)

(58) Field of Classification Search
CPC ................................ G11C 29/52; G11C 29/42

USPC ........................................................ 365/200
See application file for complete search history.

(56) References Cited

U.S. PATENT DOCUMENTS

| | | | |
|---|---|---|---|
| 8,806,297 B2 | 8/2014 | D'Abreu et al. | |
| 10,432,232 B2 | 10/2019 | Zamir et al. | |
| 2010/0169741 A1 | 7/2010 | Laurent et al. | |
| 2012/0079351 A1* | 3/2012 | Cideciyan ........... | G06F 12/0246 714/801 |

(Continued)

FOREIGN PATENT DOCUMENTS

TW 201245953 A 11/2012

OTHER PUBLICATIONS

International Search Report and Written Opinion from related International Patent Application No. PCT/IB2021/020008, dated Nov. 18, 2021, 10 pages.

(Continued)

*Primary Examiner* — Anthan Tran
(74) *Attorney, Agent, or Firm* — Brooks, Cameron & Huebsch, PLLC

(57) ABSTRACT

The present disclosure relates to operating an array of memory cells, including storing user data in a plurality of memory cells of the memory array, storing parity data associated with the user data in parity cells of the memory array, in which a number of used parity cells is selected based on a status of the memory cells and is related to a selected Error Correction Code (ECC) correction capability, and performing an ECC operation on the plurality of memory cells, the ECC correction capability being based on the selected number of used parity cells. Related memory devices and systems are also herein disclosed.

24 Claims, 9 Drawing Sheets

(56) References Cited

U.S. PATENT DOCUMENTS

| | | |
|---|---|---|
| 2013/0061113 A1 | 3/2013 | Kim et al. |
| 2013/0246878 A1 | 9/2013 | Pancholi et al. |
| 2016/0162352 A1 | 6/2016 | Singhai et al. |
| 2017/0201273 A1 | 7/2017 | Bonke |
| 2019/0035474 A1 | 1/2019 | Tassan et al. |
| 2024/0211346 A1* | 6/2024 | Laurent ................. G11C 29/42 |

OTHER PUBLICATIONS

Office Action from related Taiwanese Patent Application No. 111107518, dated Jul. 8, 2022, 12 pp.

* cited by examiner

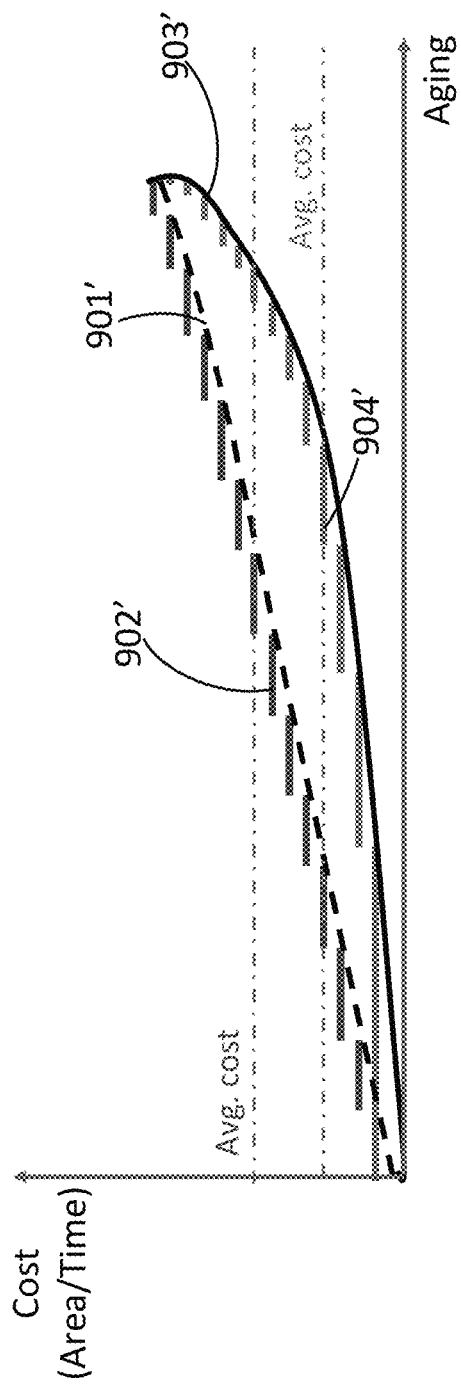
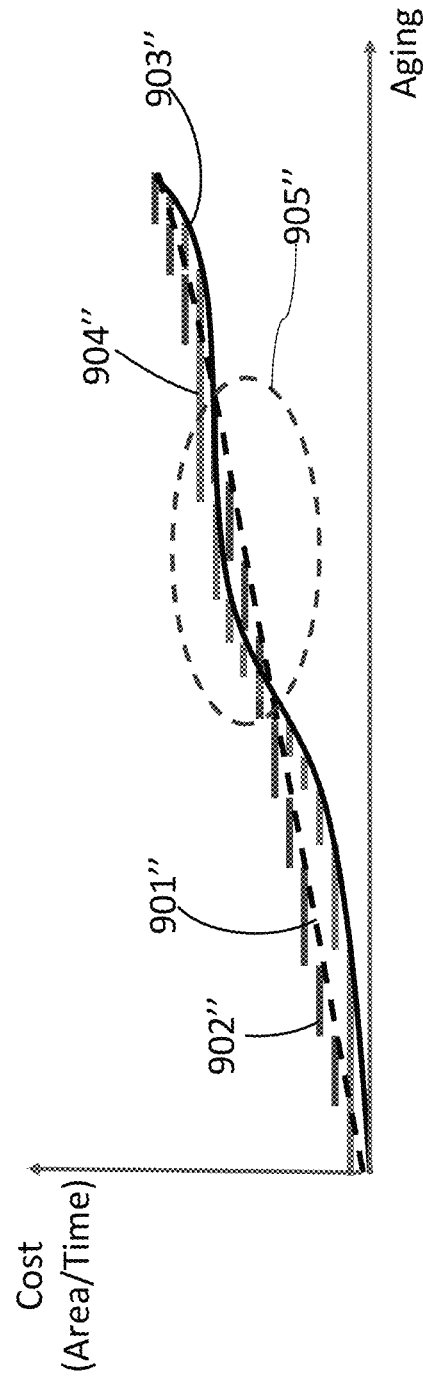
FIG. 9A
FIG. 9B

METHODS AND SYSTEMS FOR IMPROVING ECC OPERATION OF MEMORIES

PRIORITY INFORMATION

This application is a National Stage Application under 35 U.S.C. § 371 of International Application Number PCT/IB2021/020008, filed on Mar. 2, 2021, the contents of which are incorporated herein by reference.

TECHNICAL FIELD

The present disclosure relates generally to the management and operation of an array of memory cells, and more particularly to methods and systems for improving the performances of memories having ECC protection.

BACKGROUND

Memory devices are used in many electronic systems such as mobile phones, personal digital assistants, laptop computers, digital cameras and the like. Various types of memories are used in memory devices, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, nonvolatile memory cells may maintain their stored logic state for extended periods of time even in the absence of an external power source.

The information is stored by programming different states of a memory device. For example, binary devices have two states, often denoted by a logic "1" or a logic "0." In other systems, more than two states may be stored. In order to access the stored information, a component of the memory device may read, or sense, the stored state. In order to store the information, a component of the memory device may write, or program, the logic state.

Improving memory devices may include increasing memory cell density, increasing read/write speed, increasing reliability, increasing data retention, reducing manufacturing costs, scaling smaller than traditional devices, as well as reducing power consumption.

Memory cells have varying physical and electrical characteristics during their life cycle due to various factors such as number of accesses, quality of the manufacturing process, environmental factors, and the like. Error Correction Code (ECC) is usually calibrated on a defined status of the cells of the memory device (e.g. end-of-life reliability of the cells), and therefore is generally used at its highest correction power. Consequently, there is often an excessive power consumption. It is thus desirable to improve power consumption performances over the entire life of the memory device.

BRIEF DESCRIPTION OF THE DRAWINGS

FIGS. 9A and 9B are schematic exemplary graphs representing cost of an implemented ECC protection level selection technique versus aging of the cells of the array.

DETAILED DESCRIPTION

With reference to those drawings, methods and systems for an improved operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Access circuitry can differentiate between different logic states of a memory cell. For example, in case of a memory read, the access circuitry applies a voltage pulse with a particular magnitude and polarity to access lines, which results in an electrical response that dedicated sense circuitry can detect. Detecting electrical responses can include, for example, detecting one or more of a voltage drop (e.g., a threshold voltage) across terminals of a given memory cell of the array, current through the given memory cell, and a threshold event of the given memory cell.

In the present disclosure, the term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

Figure 1:
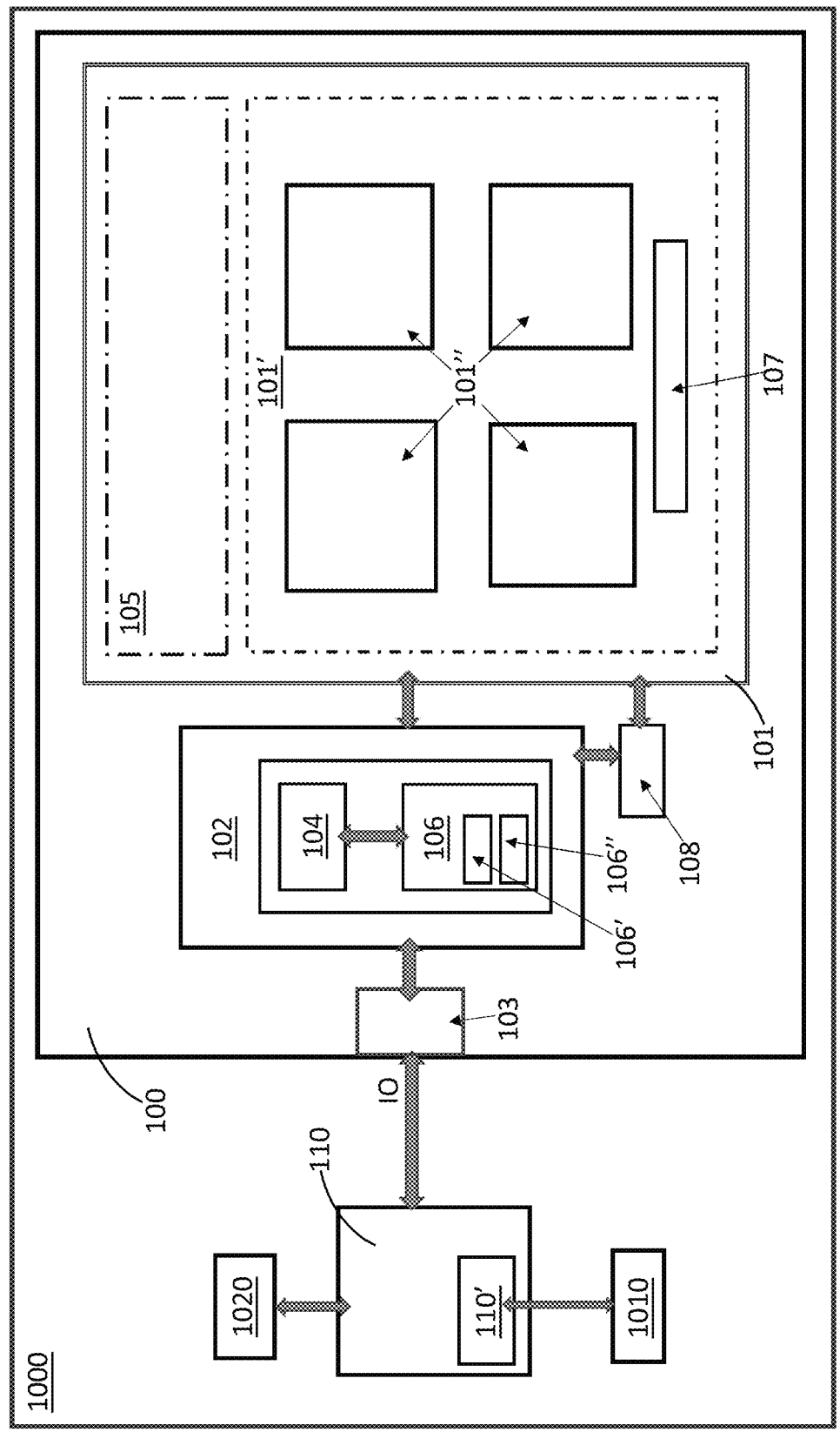
FIG. 1 is a schematic block diagram of a system comprising a memory device that may be operated according to the present disclosure.

FIG. 1 is a schematic high-level block diagram of a system 1000 comprising a memory device 100 according to an exemplary embodiment of the present disclosure, this memory device 100 being programmed to perform the ECC techniques disclosed below.

The memory device 100 can be a solid-state drive (SSD), for instance, and can include a memory section 101, a controller 102, and a host interface 103. The memory section 101 is not limited to a particular architecture and can include different types of memories.

The controller 102 may be coupled to the host interface 103 and to the memory section 101 via a plurality of channels and can be used to transfer data between the memory section 101 and a host 110. The host interface 103 can be in the form of a standardized interface. For example, when the memory device 100 is used for data storage in a computing system, the host interface 103 can be a serial advanced technology attachment (SATA), peripheral component interconnect express (PCIe), or a universal serial bus (USB), among other connectors and interfaces. In general, the host interface 103 can provide an interface for passing control, address, data, and other signals between the memory device 100 and the host 110.

The controller 102 can include an embedded firmware and is adapted to internally manage and control the operation of the memory section 101. The controller 102 can communicate with the memory section 101 to control data read, write, and erase operations, among other operations. For example, the controller 102 can include a number of components in the form of hardware and/or firmware (e.g., one or more integrated circuits) and/or software for controlling access to the memory section 101 and/or for facilitating data transfer between the host 110 and said memory section 101.

The memory controller 102 thus represents control logic of the device, for example acting in response to command by the host 110 (which may generally be an external managing system of the non-volatile memory). As will be disclosed in the following, in one embodiment, the memory controller 102 can also be implemented in the host 110, in particular as part of a host processor 110', even if the present disclosure is not limited by a particular architecture.

As disclosed in relation to FIG. 1, the memory controller 102 may receive user data through input/output IO. Multiple signal lines couple the memory controller 102 with the memory section 101. For example, such signal lines may include clock, command/address and write data (DQ), read DQ, and zero or more other signal lines. The memory controller 102 may thus be operatively coupled to the memory section 101 via suitable buses.

The memory device 100 can also comprise other components (not shown) such as processor units coupled to the controller 102, antennas, further connection means with the host device 110, and the like. In any case, the present disclosure is not limited by a specific configuration of the memory device 100.

Moreover, the controller 102 can also include its own memory section (not shown) operatively coupled with other units thereof. In any case, the present disclosure is not limited by a particular configuration of the controller 102.

The memory device 100 may be a portable device configured to be coupled to the host device 110. However, in other embodiments not shown in the drawings, the memory device 100 can also be embedded within one or more host devices. The host 110 may be for example a personal computer, a tablet, a smartphone, a server or the like. The host 110 can include a system motherboard and/or backplane and can include a number of memory access devices (e.g., a number of processors).

In an embodiment, the controller 102 includes an Error Correction Code (ECC) unit 104, also referred to as ECC engine, which is configured to operate according to techniques described in the following.

The ECC unit 104 can include error correction circuitry to detect and correct a number of bit errors, according to embodiments of the present disclosure. The ECC unit 104 is not limited to circuitry (e.g., hardware) implementations. For instance, the ECC unit 104 can be implemented in hardware, firmware, and/or software.

The ECC unit 104 can be embodied by discrete components such as an application specific integrated circuit (ASIC) or by components that reflect functionally provided by circuitry within the controller 102 that does not necessarily have a discrete physical form separate from other portions of the controller 102. Although illustrated as components within the controller 102, the ECC unit 104 can be external to the controller 102 or can have a number of components located within the controller 102 and a number of components located external to the controller 102, wherein the present disclosure is not limited by a specific hardware architecture. The ECC unit 104 can include separate encoding and decoding components, in a number of embodiments. In general, the memory device 100 thus comprises an operating unit which is an ECC engine coupled to the controller 102.

In other words, the error detection/correction circuitry of the ECC unit 104, which may be programmed as disclosed below, can include hardware logic to implement an ECC to detect errors occurring in data read from memory section 101. In one embodiment, error detection/correction circuitry also corrects errors (up to a certain error rate based on the implemented ECC code).

The memory section 101 of the memory device 100 can be a flash memory including an array of memory cells, for example a NAND memory, NOR memory, AND memory, and the like. Additionally or alternatively, memory section 101 may comprise bit alterable memory cells; for example, Phase Change Memory (PCM), Ferroelectric Memory (Fe-RAM), Magnetic Memory (MRAM), chalcogenide-based Self Selecting Memory (SSM), etc. Any kind of memory may be employed in embodiments of the present disclosure. For example, the disclosure applies to either or both non-volatile and volatile memories.

In general, the memory section 101 may comprise an array of memory cells 101'. Non-volatile memories may comprise a plurality of blocks, each block being indicated herein with the reference number 101" and comprising a defined number of pages. For the sake of simplicity, only four blocks 101" are shown in the example of FIG. 1.

The memory section 101 represents the memory resource for the memory device 100. In one embodiment, the array of memory cells 101' is managed as rows of data, accessed via wordline (rows) and bitline (individual bits within a row) control. The array of memory cells 101' can be organized as separate channels, ranks, and banks of memory, in general in a plurality of portions, as previously disclosed. Channels are independent control paths to storage locations within memory section. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In other words, according to an embodiment of the present disclosure, the array of memory cells 100' may be subdivided into a plurality portions, such as a page, a single block, a group of blocks, or even all blocks (i.e. all the cells), the invention not being limited thereto. The memory cells can thus be grouped, for instance, into a number of blocks including a number of physical pages. A number of blocks can be included in a plane of memory cells and an array can include a number of planes.

Embodiments are not limited to a particular type of memory array or array architecture and the techniques of the present disclosure may be applied to several memory technologies (e.g., planar, cross-point, 3D, etc.).

Memory section 101 may also comprise a circuit portion 105 operatively coupled to the array of memory cells 101'.

In one embodiment, the circuit portion 105 includes access circuitry and sense circuitry to detect electrical responses of the one or more memory cells to an applied read voltage. In one embodiment, the sense circuitry includes sense amplifiers. FIG. 1 illustrates the circuit portion 105 as being embedded in the memory section 101; however, other embodiments can include access circuitry and/or sense circuitry that is separate from the memory section 101. For example, access circuitry and sense circuitry can be included in a memory controller such as the memory controller 102.

Furthermore, the memory device 100 may comprise a counting unit 106 configured to account for the status of the memory cells of the array of memory cells 101' and for determining a trigger event to activate the ECC unit 104.

More in particular, the counting unit 106 may comprise a first counter 106' and a second counter 106". The first counter 106' may be configured to account for the lifetime of the array of memory cells 101' (or of portions thereof), as it will be disclosed below. For example, the first counter 106' may be apt to count the number of accesses, or the number of refresh events, or the number of power-up events, or a combination thereof, in accordance with embodiments disclosed below. The second counter 106" may be configured to count the number of errors detected by the ECC unit 104, in accordance with embodiments disclosed below.

In the example of FIG. 1, the counting unit 106 is depicted as integrated into the controller 102, even if other architectures are possible and the counting unit 106 may also be external to the controller 102 and connected thereto.

Furthermore, the memory device 100, in particular the array of memory cells 101' of the memory section 101, may comprise a non-volatile region 107 apt to store operating information, for example for the management of the memory array according to embodiments disclosed in the following.

In embodiment, the memory device 100 may also comprise a sensing unit 108 comprising one or more sensors operatively coupled to the memory section 101 and optionally to the controller 102. The sensing unit 108 may be configured to detect a status (e.g. the temperature) of the array of memory cells 101' or of a portion thereof.

Generally, the particular architecture of the memory device 100 may vary according to the needs and/or circumstances without limiting the scope of the present disclosure.

The host 110 and the memory device 100 may form a system 1000. As mentioned before, the host device 110 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The host 110 may generally be a system managing the memory section 101, which may be embedded in said system or generally managed by said system. The memory device 100 may thus be managed by an external controller, i.e. the controller embedded in the processor 110' of the host 110, as previously disclosed, so that the ECC unit may also be included in said external controller. In this case, the controller of the memory device may not be present and the memory device 100 (which may be embedded in the host 110) communicates the required information to the external controller.

In one embodiment, the system 1000 includes an interface 1010 coupled to the processor 110', which can represent a higher speed interface or a high throughput interface for system components that needs higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1020 communicatively coupled to the host or to memory device for example for connecting with other systems, and/or a battery coupled to provide power to said system.

According to the present disclosure, the ECC unit 104 may be configured to perform an ECC operation (detection and/or correction of errors) with a certain error correction capability on a codeword stored in the memory section 101, wherein the codeword includes a certain number of parity bits, as it will be disclosed in the following.

Figure 2:
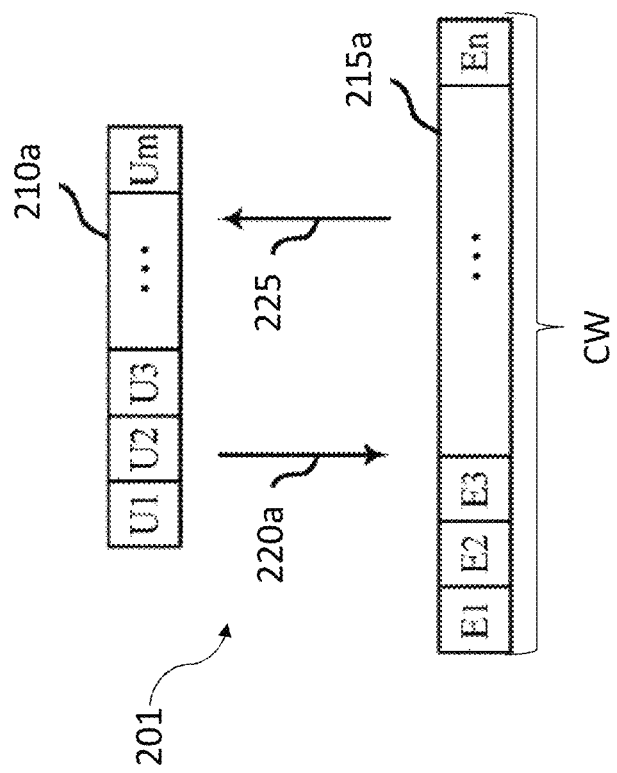
FIG. 2 is an example of user data pattern encoded according to embodiments of the present disclosure.

FIG. 2 illustrates an exemplary user data pattern diagram 201. The user data pattern diagram 201 includes user data 210a and encoded user data 215a. Encoding process 220a, which is performed in the programming phase of the array of memory cells, may convert the user data 210a (U1, . . . , Um) into the encoded user data 215a (E1, . . . , En). The encoded user data 215a may be stored in a set of memory cells, which may be, for example, memory cells of the memory section 101 of FIG. 1. Each box of the encoded user data 215a may correspond to a memory cell that may exhibit a logic state of 1 or a logic state of 0. In embodiments of the present disclosure, during the encoding process 220a, a number of parity bits may be added to the user data 210a. A number of bits in the encoded user data 215a may be greater than the number of bits in the user data 210a (e.g., n is larger than m if some bits, e.g. parity bits, are added). Process 225 may convert the encoded user data 215a back to the user data 210a after the encoded user data 215a have been accurately read.

In an embodiment, the plurality of encoded bits to be read represents a codeword (CW). The codeword may be programmed to include various information to be used during the reading phase. In order to keep a smooth and simple description, in the following reference will be made to ECC-related information only. It is understood that the additional bits may include not strictly ECC-related information, though. Examples may include encryption bits, scrambling bits, bits for balanced or quasi-balanced codes (e.g., to achieve a predefined percentage, or within a percentage range, of bits in a given logic state, such as 50% of 1 s or 0 s), and/or other purpose additional bits.

As mentioned before, when digital data are stored in non-volatile memory (such as the array of memory cells 101' of FIG. 1), data are encoded in such a way that a decoder can identify and correct errors, i.e. data strings are encoded by adding a number of parity bits. When the original data is to be reconstructed, the decoder examines the encoded message to check for any errors. In certain embodiments, a block of user data bits is encoded to become a block of n bits (i.e., the codeword CW), as shown in FIG. 2. However, various encoding schemes are possible.

During the lifetime of the memory array, the Bit Error Rate (BER) associated to the data stored in the memory cells evolves based on several factors, such as, for example, a number of accesses to the memory cells, process quality, environment (space, power supply voltage, operating and storage temperature, etc.), and the like. For some technologies, the BER is typically better at the beginning of the die life and worst at the end of life, while, for some others, the BER could be better after some cycles than at the beginning and at the end of life of the die.

The present disclosure provides systems and methods to tailor the evolution of the BER and to enable a lower ECC protection when the BER is low and to increase said protection when the BER is higher. In other words, the present disclosure provides a technique to precisely define the ECC correction capability (or ECC protection level) to be applied to the cells of a memory array according to the status thereof. In the context of the present disclosure, the "status" of a cell is meant as its operating condition or generally its health. As mentioned above, often the status of a memory cell or a plurality of memory cells may depend on several present and past parameters. The principles of the present disclosure may be applied to several types of volatile or non-volatile memories which show a time-varying status of their memory cells.

On the basis of the encoding scheme, a codeword is generated (process 220a) manipulating the user data bits and adding a number of parity bits, the number of added parity bits depending on the ECC correction capability (the more potential errors are to be detected and corrected, the more parity bits are necessary). The ECC unit 104 may generate the codeword according to the selected ECC protection level. According to the disclosure, the ECC protection level and the number of additional parity bits (that are intrinsically tied) may vary in operation. Based on the decoding scheme, an ECC syndrome is produced from the encoded set of user and parity data, for instance by means of the ECC unit 104 of FIG. 1. The ECC syndrome changes depending on the presence and location of errors. When errors are detected, the ECC unit 104 is able to correct said errors up to and according to the implemented correction capability. In some cases, the presence of an uncorrectable error (e.g., the location of which is unknown) may be reported.

The number of used parity bits and the ECC correction capability are, therefore, intrinsically tied to each other. When programming a data into memory, the desired level of ECC protection (correction capability) can be selected and a corresponding number of parity bits allocated for storing the parity information. At read back, the codeword (including user data and parity bits used during the encoding phase) is accessed and decoded according to the ECC scheme. An ECC engine (implemented in hardware, for example) with a given maximum correction capability may operate at different correction capabilities each requiring a corresponding number of parity bits. For example, less or more parity bits may be considered either in encoding or decoding for a lower or higher ECC protection level, respectively; correspondingly, a smaller or higher power is consumed.

Figure 3:
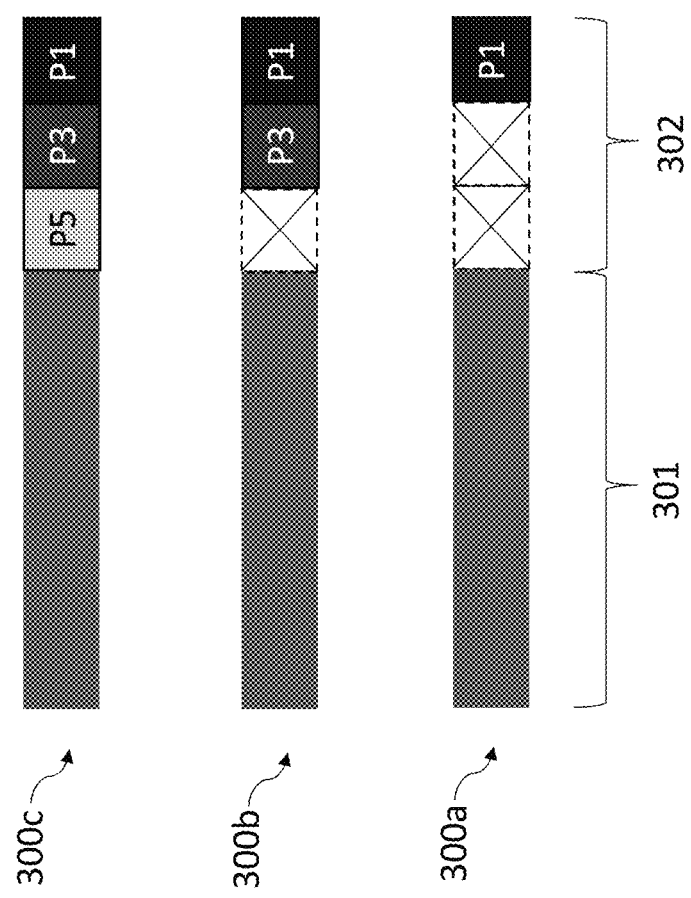
FIG. 3 shows examples of selection of a number of parity cells in a codeword according to embodiments to the present disclosure.

Referring now to FIG. 3, according to an embodiment of the present disclosure, the ECC protection level is selectable according to the status of the cells of the memory array. In other words, the ECC protection is adapted to the memory cell health and increased only when necessary, i.e. when the status of the cells requires it.

As shown before, when user data (i.e. the payload content of a codeword) are stored in a plurality of memory cells of the memory array, also parity data are stored in parity cells of the memory array associated with the user data. The number of used parity cells is selected based on the status of the plurality of memory cells, this selected number being related to the ECC protection level, e.g., the desired or selected ECC correction capability. The ECC operation is then performed based on the selected number of parity cells, i.e. on the basis of the stored parity bits, which may vary according to the cell health.

More in particular, the used parity cells are selected between a defined maximum number and a minimum number and the number of unused parity cells is the difference between the maximum defined number and the used number of parity cells, wherein, according to an embodiment, the unused parity cells (which are adapted to store parity data corresponding to higher ECC correction capability) are not written nor sensed.

As shown in FIG. 3, a codeword may comprise a first codeword portion 301 corresponding to the payload (thus including encoded user data), and a second codeword portion 302 corresponding to the parity data. It is noted that such a distinction may be somehow arbitrary; as a matter of fact, an encoding process (such as process 220a in FIG. 2) may combine and mix the user data and the parity data so that the codeword as a whole should be considered.

When a minimum protection is needed, only a reduced number of parity cells may be used, as in codeword 300a where only the cells indicated as P1 are used to store parity bits (e.g. only a number of bits to calculate syndrome S1 corresponding to ECC1 is stored, wherein ECC1 may be an error correction code with correction capability of 1 bit, in some examples).

When ECC protection has to be increased, an increased number of cells may be used, as in codeword 300b, where an increased number of parity bits (P1 and P3) is stored to calculate syndrome S1 and S3 (e.g., corresponding to ECC2, wherein ECC2 may be an error correction code with correction capability of 2 bits, in some examples).

When protection has to be at a maximum level, the number of used parity cells may be further increased, as in codeword 300c where an increased number of parity bits (P1, P3 and P5) is stored to calculate syndrome S1, S3 and S5 (e.g., corresponding to ECC3, wherein ECC3 may be an error correction code with correction capability of 3 bit, in some examples). It is observed that a single block of the codeword portion 302 does not necessary correspond to a single cell and may also corresponds to a group of cells, e.g. it generally represents the number of bits to calculate the syndrome for a corresponding ECC protection level. It should be understood that, while three levels of protection are depicted in FIG. 3 (e.g., ECC1, ECC2 and ECC3), any number may be conceived. For example, embodiments with higher (e.g., N>3) error correction capability and/or embodiments featuring no ECC protection at all (e.g., no parity bit added to the codeword for the purpose of error correcting it) are possible.

The reduction of the ECC protection level to the minimum necessary thus corresponds to the reduction of the number of used parity cells.

The present disclosure provides systems and methods to tailor the evolution of the BER and to enable a lower ECC protection when the BER is low and to increase said protection when the BER is higher. According to embodiments of the method, user data are stored in a plurality of memory cells of the memory array, parity data associated with the user data are stored in parity cells of the memory array, and a number of used parity cells is selected based on a status of the memory cells and is related to a selected Error Correction Code (ECC) correction capability. The ECC engine, that has a defined maximum error correction capability (either hardware or software limited) may be operated to an inferior error correction capability corresponding to the used number of parity cells. Said it differently, whenever a lower (or higher) ECC protection level is desired, the corresponding number of parity cells is selected and used for storing parity information, and/or vice-versa. The ECC correction capability may be dynamically changed during the lifetime of the device; correspondingly, the number of used parity cells is adaptively changed so as to allow the ECC engine to work at the desired level. The method also comprises, based on the selected number of used parity cells, performing an ECC operation on the plurality of memory cells (with the corresponding level of protection from errors).

As an example, in some cases, at the start of life of the array, ECC1 may be used and, at end of life, ECC3 may be used (and therefore an increased number of parity cells may be used). However, also different cases are possible, including cases in which at the start of life a maximum ECC protection level is needed and after some cycles (e.g. after seasoning or in general after usage of memory cells), the ECC protection level may be reduced.

Unused parity cells (e.g. crossed boxes of codeword portion 302 of FIG. 3) are not sensed nor written, leading to a reduced power consumption. In other words, only the cells selected to store parity data are written and/or sensed, while further memory cells adapted to store parity data and corresponding to higher ECC correction capabilities (and not currently used) are not written nor sensed.

With a reduced ECC protection level, fewer cells are thus used. The resulting error probability is therefore lower since the unused cells do not participate to the Codeword Error Rate (CWER). Additionally, unused cells remain fresh for a longer time, and will less concur to the CWER when they are used after some time.

The ECC technique of the present disclosure thus provides that, when a lower ECC protection level is used, only the necessary cells are written or sensed. As a nonlimiting example, for 128 user data bits, ECC1 needs 8 parity bits (providing the capability to detect and correct 1 error out of the 128+8 bits), ECC2 needs 16 parity bits (providing the capability to detect and correct 2 errors out of the 128+16 bits), ECC3 needs 24 parity bits (providing the capability to detect and correct 3 errors out of the 128+24 bits). Using ECC1 instead of ECC3 avoids managing 10.5% of the cells. The reduction of the number of used cells corresponds to a reduced power consumption, since only the necessary ECC circuitry is enabled, said circuitry requiring less power when a lower ECC protection is required.

As observed with reference to FIG. 1, ECC circuitry may be integrated in the controller of the memory device, which is properly programmed to execute the ECC techniques of the present disclosure.

Furthermore, different portions of the array of memory cells may have a different status and/or may exhibit different defect densities. According to an embodiment of the present disclosure, the memory cells of the array may be grouped into a plurality of portions, each portion being assigned a specific ECC protection level based on the status of the memory cells thereof. Different portions may thus have different ECC protection levels as well as a same protection level, depending on the specific circumstances. A "portion" of the array is therefore a group of memory cells having the same ECC protection level. In this way, the array may be split into portions in which the ECC correction capability is coherent but could be different from the ECC correction capability of another portion.

According to an embodiment, a memory portion may correspond to an internal subdivision like a bank group, a bank, a section or whatever other suitable internal subdivision of the memory. Moreover, the memory portion may also correspond to a specification/host subdivision like a buffer, a page, i.e. a subdivision at high level. In an embodiment, the whole memory array may be coherent in term of ECC correction capability.

In other words, a portion may correspond to one of a codeword, a bank, a bank group, a section of the array, the entire array, or even a buffer, a page, and the present disclosure is not limited by the way the cells are grouped.

The subdivision of the array into several portions, possibly having different ECC protection levels, is better suited to real memory devices.

Figure 4B:
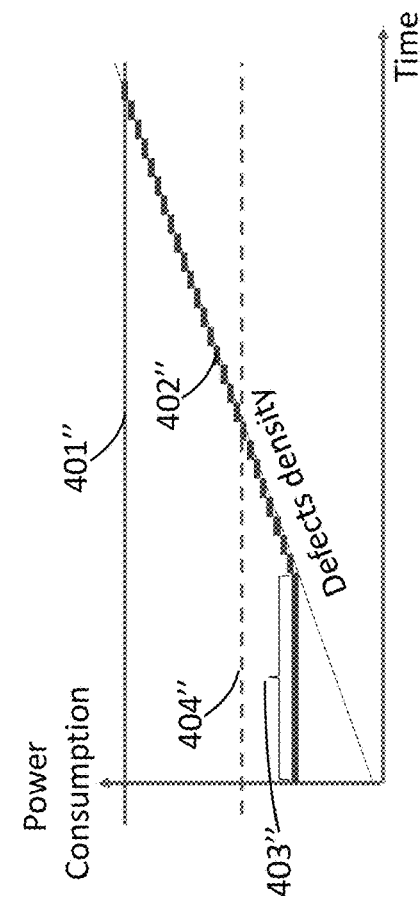
FIGS. 4A and 4B are graphs showing power consumption versus time as a result of techniques according to the present disclosure.
Figure 4A:
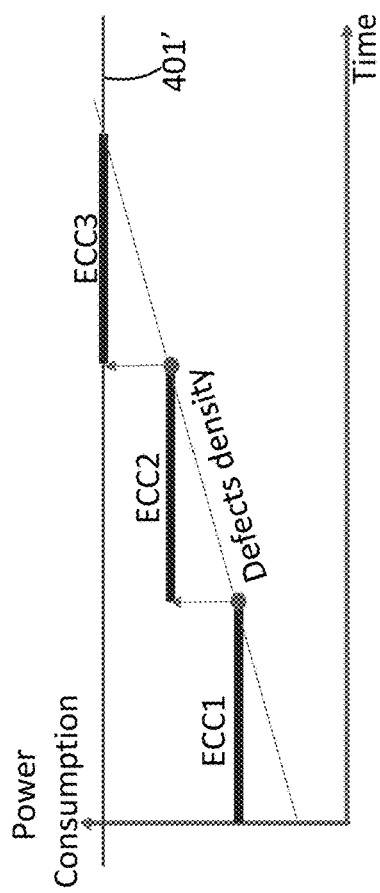

FIGS. 4A and 4B are graphs showing power consumption (on the Y-axis) versus time (on the X-axis), according to embodiments of the present disclosure. It should be noted that, despite time is represented on the X-axis, the concepts herein disclosed are not limited to power consumption evolution vs. time and, rather, they applies to whichever factor that may potentially affect the Bit Error Rate of the memory cells (e.g., cycling, endurance, aging, exposure to high/low temperatures, hard/soft failure mechanisms, voltage drift, etc.; accordingly time is only of many possible examples and the figure should be correspondingly broadly interpreted). In particular, in an example, the time increase of the power consumption may correspond to an increase in the defect density. FIG. 4A shows that ECC protection level may be varied during the life of the memory array; specifically, FIG. 4A is an example of a portion of the array in which the starting protection level is low (e.g. ECC 1, corresponding to a low power consumption), this protection level being increased over time based on the increase in the defect density, e.g., the bit error rate. It is also possible a situation (not shown in the drawings) in which the protection level is lowered over time, depending on the specific technology of the memory adopted. Line 401' of FIG. 4A represents the prior art average cost in terms of used parity cells (e.g., P1, P3 and P5 in case of ECC3, as depicted in FIG. 3) and thus of consumed power, which is always at a maximum level, while according to the present disclosure the average power cost may be significantly reduced, since for a significant period of time the ECC protection level is not at maximum level (e.g., when ECC1 and/or ECC2 are used, respectively requiring only P1 or only P1 and P3 parity cells). FIG. 4B represents a case in which the array is divided into multiple independent portions. As in FIG. 4A, line 401" of FIG. 4B represents the prior art average cost in terms of used parity cells (e.g., P1, P3 and P5 in case of ECC3, as depicted in FIG. 3) and thus of consumed power, which is always at a maximum level. In the case of FIG. 4B, each step 402" corresponds to a single portion increasing its ECC protection level, and plateau 403" represents an exemplary initial condition wherein all the portions have minimum protection level (e.g. ECC1, requiring only P1 parity cells, even though a situation in which no ECC is initially implemented is possible, with no parity cell required at all) for a duration of time. In this embodiment, the high granularity ensures better performances, as represented by line 404", which is the average power cost, as compared with state of art line 401". Therefore, when increasing the granularity, smaller steps (corresponding to smaller portions) are possible, leading to a benefit increase.

FIGS. 4A and 4B are examples showing a case in which the starting ECC protection level is low and then it is increased over time following the increase in defect density. It should be noted that, for improved graphical representation, the defect density or BER is depicted in FIGS. 4A and 4B as a linearly increasing functions with time (e.g., a line with positive slope). This is not the typical case and it is understood that any BER variation profile may be considered, linear or not. According to the disclosure, the ECC protection level or correction capability is varied or adjusted based on a variation of the BER (e.g., at any time when it is necessary to do so), therefore insuring the optimal usage of the ECC engine in any circumstance. Alternatively or additionally, depending on the technology, the starting ECC protection level may be higher (e.g., ECC3) at a given moment in time, such as at start of life, and it could be decreased over time (e.g., to ECC2 and/or to ECC1), so that said graphs could also have a decreasing trend.

In any case, according to the present disclosure, the memory is configured so that the ECC correction capability is varied (increased or decreased according to the specific technology) with the lifetime of the memory cells array based on the time-varying status thereof, which has many benefits in terms of power consumption.

According to an embodiment, data information relating to the selected ECC correction capability is stored in one or more dedicated non-volatile region(s) of the memory array. In other words, the array comprises a non-volatile region adapted to store the data information relating to the selected ECC correction capability, in particular the selected ECC protection level for each portion of the array. For example, with reference to FIG. 1, the non-volatile region dedicated to store said information may be the non-volatile region 107 of the memory section 101.

More in particular, when the array is subdivided into a plurality of portions, respective data information relating to the selected ECC correction capability for each portion is stored in the non-volatile region (which may be a single region or also may be subdivided into multiple regions of the array).

In an embodiment, this data information is then stored in a look-up table in which each portion of the array is associated with its respective selected ECC correction capability. The information about the ECC protection level of each portion can thus be transferred in a lookup table containing the information of all the memory portions and their current ECC protection level, which simplifies the reading of this information.

In an embodiment, the codeword itself may comprise the information indicating its current ECC protection level, leading to an extreme granularity. In this way, any specific codeword may be encoded with additional information bits associated thereto and relating to the selected ECC correction capability for said codeword. In this embodiment, more space of the array is required to store the information about the ECC protection level of each codeword, but the power benefits are increased.

Several ways to manage different encoding of codewords in various portions are thus possible, the information relating to the ECC protection level of each portion being then stored in the array.

Figure 5:
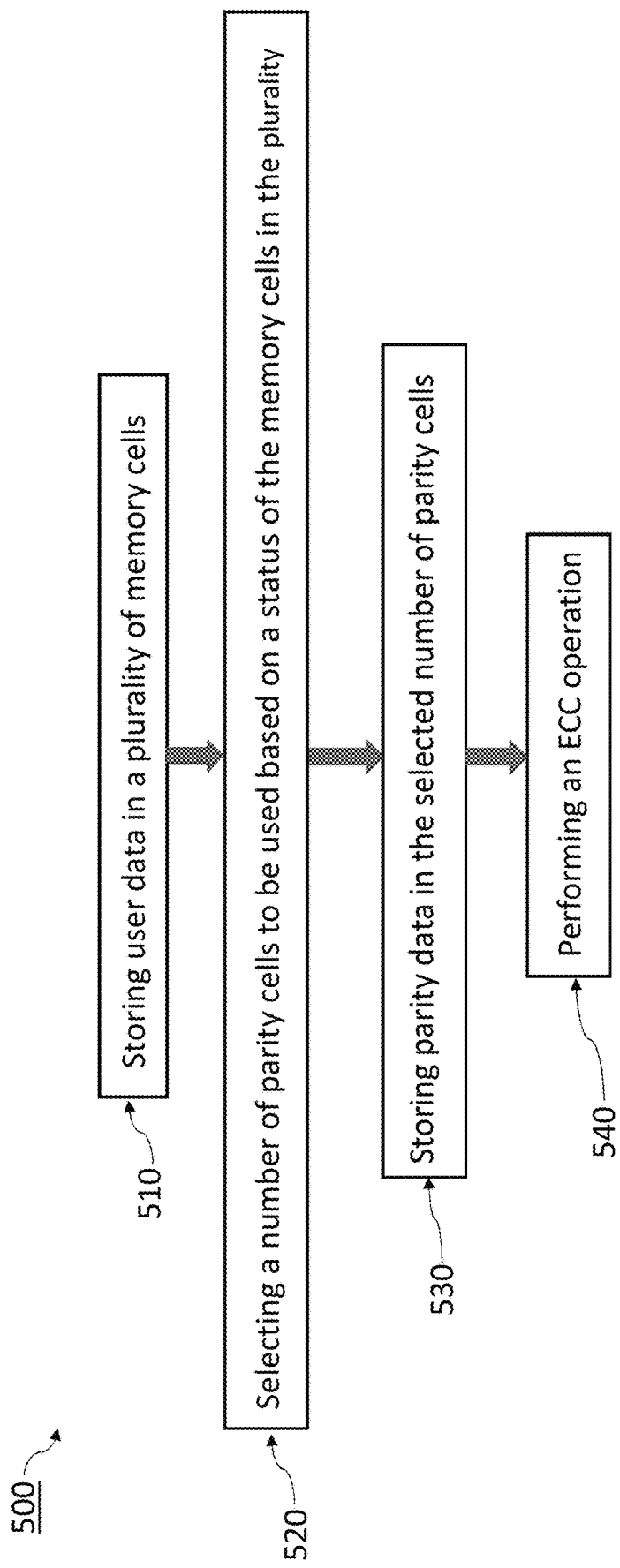
FIG. 5 is a flow diagram of steps of a method according to an embodiment of the present disclosure.

FIG. 5 a is flow diagram representing steps of a method 500 for operating an array of memory cells according to the present disclosure. The processes described can be performed by hardware logic and circuitry. For example, the following processes are described as being performed by access circuitry, sense circuitry and ECC circuitry, as disclosed herein. However, other embodiments can include different circuitry configurations suitable for performing the processes.

The method of the present disclosure is a method for improving the operation of memory cells having ECC protection. Access circuitry writes data to a plurality of memory cells. For example, access circuitry writes logic 0 s and logic 1 s to a plurality of memory cells such as the memory cells in the memory section 101 of FIG. 1. In one embodiment, access circuitry can write logic 0 by applying programming pulses with a negative polarity and logic 1 by applying programming pulses with a positive polarity. The opposite convention can also be adopted. Different programming pulses may be applied to memory cells, depending on the technology. After writing data to the plurality of memory cells, access circuitry can read the plurality of memory cells and ECC circuitry can verify the presence of errors and correct them.

More in particular, at step 510, user data are stored in a plurality of memory cells of a memory array, e.g. are stored in a codeword.

At step 520, a number of parity cells to be used is selected based on a status of the memory cells in the plurality, this number being related to a selected ECC correction capability. An ECC engine may operate at a different correction capability (e.g., different level of protection from errors), and each of the protection levels requires a corresponding number of parity bits, as explained above with reference to FIG. 3, for example.

At step 530, parity data are stored in the selected number of parity cells. The parity data may be associated to the user data and may be computed based on the related selected ECC correction capability.

Finally, at step 540, based on the selected number of used parity cells, an ECC operation (verify/correction) is performed on the plurality of memory cells. The ECC operation may be performed using the selected ECC correction capability, e.g., encoding a corresponding number of parity data, during a program operation, or accessing the appropriate number of parity bits and feeding them to the ECC engine for decoding the codeword with the selected ECC correction capability during a read operation.

In order to determine the status of the array (or of a portion thereof), and thus to determine when (and how) the ECC protection level should be changed, several techniques or criteria may be implemented.

According to an embodiment, the triggering event may be provided by a counting unit, such as counting unit 106 of the exemplary memory device 100 of FIG. 1. More in particular, as disclosed with reference to the example of FIG. 1, the memory device 100 comprises the first counter 106', which may be configured to account for the lifetime of the memory cells. The first counter 106' is herein also referred to as cycle counter and is configured to count the occurrence of particular events of portions of the array.

In an embodiment, the first counter 106' is configured to count a number of accesses to the memory cells. However, the present disclosure is not limited to counting the accesses to the memory cells, and the first counter 106' may also be configured to count other events, such as a number of refresh events or a number of power-up events or a combination thereof. In any case, in this embodiment, the number of parity cells to be used for defining the proper ECC correction capability (and therefore the proper number of stored parity bits) is selected based on the value of the first counter 106'.

The first counter 106' may be a non-volatile counter accounting for the elapsed lifetime of memory cells, this information being maintained in the memory even after a switch off event thereof.

Figure 6B:
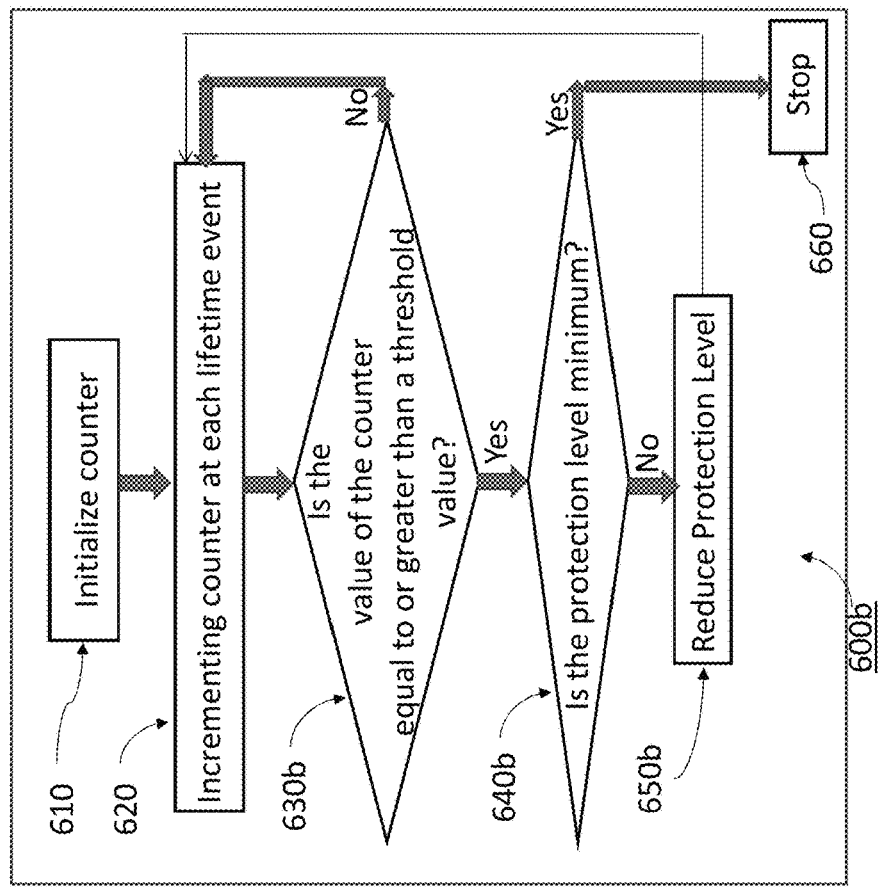
FIGS. 6A and 6B are flow diagrams representing techniques for selecting an ECC protection level based on a lifetime counter, according to different memory technologies.
Figure 6A:
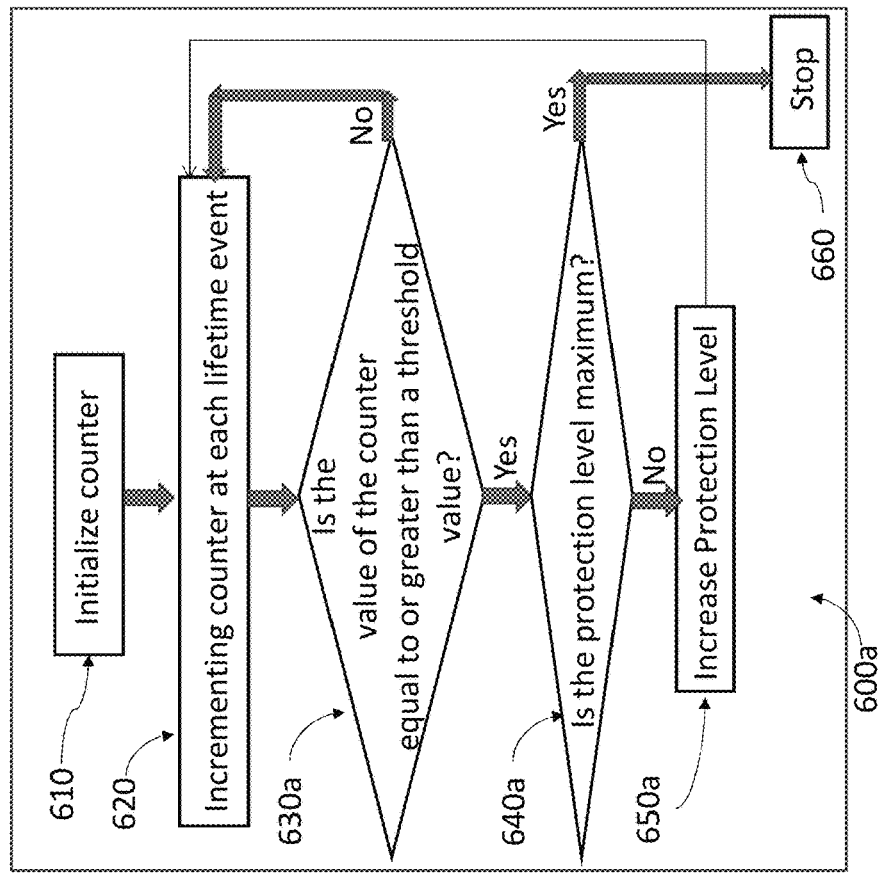

FIGS. 6A and 6B are flow diagrams 600*a* and 600*b* for the selection of the ECC protection level based on the value of the first counter 106' (i.e., based on this lifetime counter). As mentioned before, a lifetime event may be an access to the cells of a portion, as well as many other events. More in particular, FIG. 6A represents a case 600*a* in which the ECC protection level is increased during the life of the array, while FIG. 6B represents a case 600*b* in which the ECC protection level is reduced during the life of the array (e.g. in case of memory technologies showing better performances after some cycles). In other words, ECC protection level can be increased or reduced depending on what is expected for a specific technology (which may be mapped in a dedicated Look-up table stored in the memory array). A mixed solution is also possible, in some cases (not shown).

More particularly, method 600*a* may comprise: initializing the counter (step 610), incrementing the counter at each lifetime event (step 620), comparing the value of the first counter to a pre-set threshold value (step 630*a*), and, when it is not equal to nor greater than this threshold value, continue from step 620, while, when it is equal to or greater than this threshold value, checking if the protection level is maximum (step 640*a*) and, if it is not, increasing the protection level (step 650*a*), while, if the protection level is already at its maximum level, stop (step 660).

Similarly, method 600*b* may comprise: initializing the counter (step 610), incrementing the counter at each lifetime event (step 620), comparing the value of the first counter to a pre-set threshold value (step 630*b*), and, when it is not equal to nor greater than this threshold value, continue from step 620, while, when it is equal to or greater than this threshold value, checking if the protection level is minimum (step 640*b*) and, if it is not, reducing the protection level (step 650*a*), while, if the protection level is already at its minimum level, stop (step 660).

Said differently, the ECC protection level is changed (e.g., increased or decreased) when a counter representative of the usage or lapsed lifetime meets a threshold value, as shown in FIGS. 6A and 6B. Therefore, in this embodiment, the first counter is apt to indicate the status of the memory cells (more particularly the status of the memory cells of the various portions, so that different counters may be implemented for corresponding different portions). For example, a specific counter is associated with a specific portion to trigger a variation of the specific ECC correction capability applied to the respective portions based on the specific usage of the respective memory cells. This technique to select the ECC protection level is herein referred to also as lifetime-based technique.

According to another embodiment of the present disclosure, the memory device comprises also a second counter, such as for example the second counter 106" of FIG. 1, which is configured to count a number of errors detected by the ECC, so that the EEC protection level decision is based on this error bit frequency counter.

As in the case of the first counter 106' (i.e., the non-volatile counter used for example to count the number of accesses), also the second counter 106" may be a non-volatile counter, in some examples.

More in particular, in this embodiment, the number of parity bits used for defining the proper ECC correction capability is selected based a counted error frequency, which is obtained as the ratio of the first counter 106' and the second counter 160" values.

Figure 7:
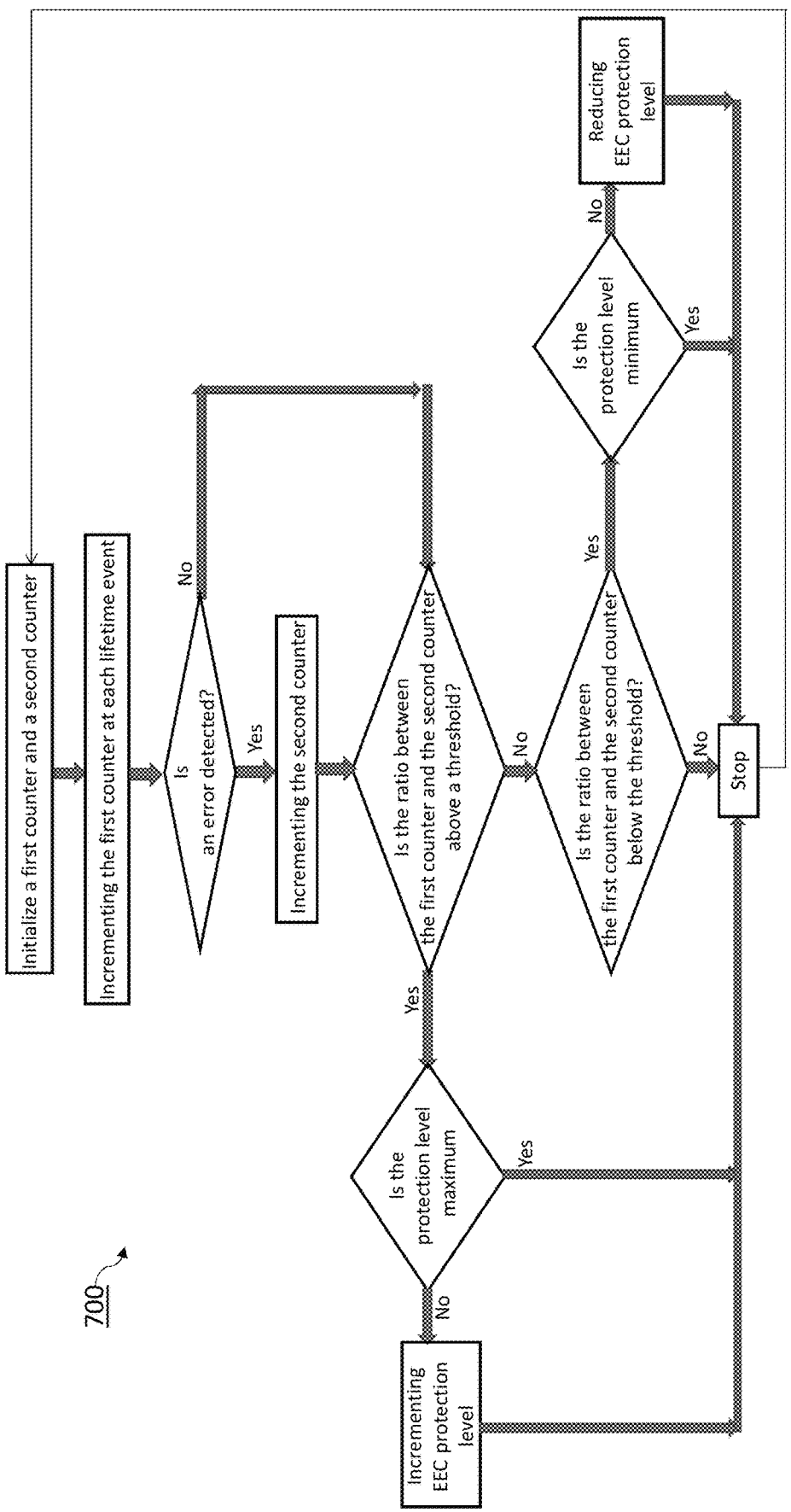
FIG. 7 is a flow diagram representing a technique for selecting the ECC protection level based on a counted error frequency.

FIG. 7 is flow diagram 700 representing the selection of the ECC protection level based on the counted error frequency.

In particular, the value of the second counter 106" is incremented each time an error is detected by the current implemented ECC. Moreover, each time a lifetime event (e.g., an access) is counted by the first counter 106' (i.e., each time the first counter 106' is incremented), the ratio between the value of the first counter and of the second counter is calculated, yielding the error frequency. This ratio is then compared with a pre-set threshold value.

For example, when the error frequency is greater than the threshold value, the ECC level protection is increased, while when the error frequency is smaller than the threshold value, the ECC level protection is reduced, or vice versa depending on the specific adopted memory technology.

In other words, the number of parity cells used for defining the ECC protection level may be selected based the counted error frequency, which is obtained as the ratio of the content of the first counter and the second counter, the second counter being used to count the number of errors detected by the current ECC. Therefore, in this embodiment, the error frequency indicates the status of the memory cells. This technique to select the ECC protection level is herein referred to also as defectivity-based technique, and it is not limited by the error frequency detection only, and other measurements of defectivity can be used as shown below.

In an embodiment, the counted error frequency may be assigned a different weight depending on the number of errors (e.g., 1, 2 or 3) detected in a same codeword.

As mentioned before, according to the present disclosure, different portions are independently assigned a proper ECC protection level based on their status. Therefore, according to an embodiment, each portion may comprise one or more counter (e.g., the first counter and the second counter) for defining the status thereof. In this way, different counters are associated with different respective portions of the array, each counter being representative of a respective accumulated value (such as number of accesses, number of errors, etc.) for the respective portion, as disclosed above. The ECC protection level variation is thus performed on one or more portions in case the respective accumulated value is equal to or exceeds (or, in other embodiment, is lower than) a threshold value, as seen with reference to FIGS. 6A-6B and 7.

The counter/s may also be updated by host or by internal sensors in order to count array time life, as it will disclosed below.

In any case, the present disclosure is not limited by a specific criterion to determine when the ECC protection level may be changed, and many other techniques are possible.

In some embodiments, a higher protection level may be selected based on an error count during an access operation. For example, detecting one additional error (e.g., with respect to the number of errors previously detected) may trigger an increase of ECC protection level to be applied. In a practical example, if no errors have ever been detected when accessing a codeword, an ECC1 protection level is appropriate (e.g., an ECC correction capability of one error); when an error is detected for the first time, the ECC protection level may be increased to provide ECC2 correction capability (correspondingly activating the additional parity cells as explained above with reference to FIGS. 3-7) in subsequent access operations. Similarly, when a second error is detected, the ECC protection level is further increased, for example to an ECC3 correction capability.

According to an embodiment, the initial status of the memory cells of the array may be defined during sort, e.g., via a testing machine used for evaluating process quality. In this case, the quality of at least one portion of the memory array is firstly tested by means of the testing machine; after the testing operation, the proper number of parity bits to be used for defining the required ECC correction capability is assigned to each portion of the array based on the performed quality test. In other words, testing evaluation may be used to assign a proper starting protection level for each portion.

Figure 8:
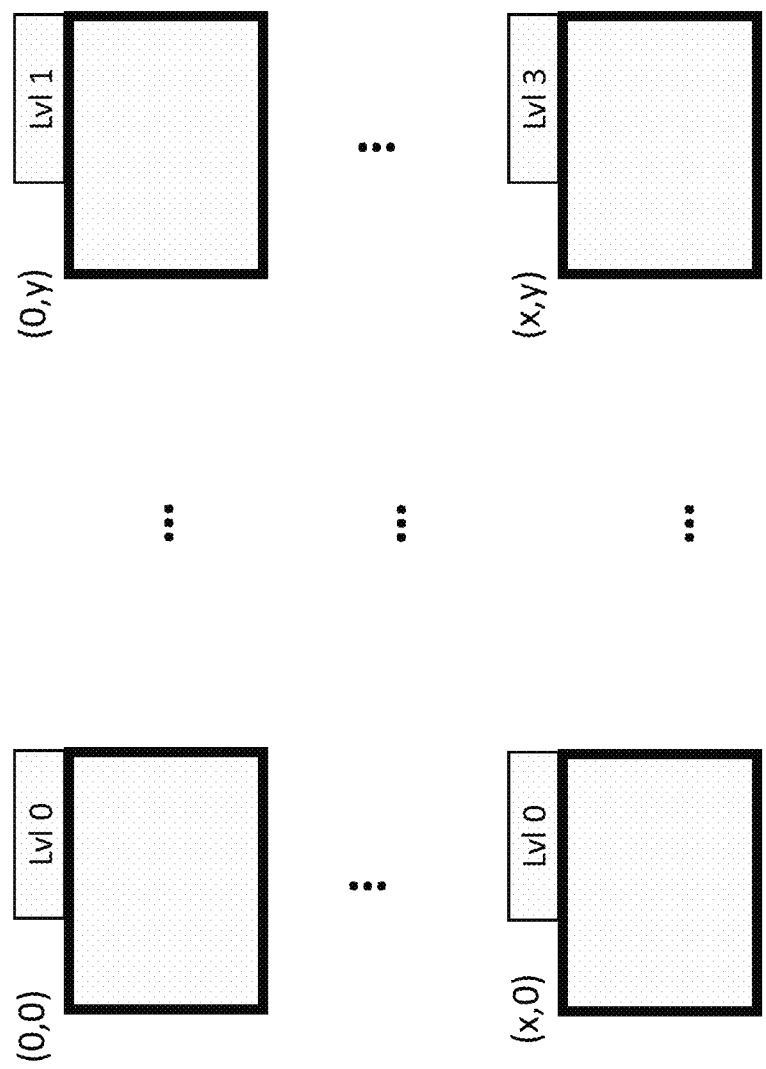
FIG. 8 schematically shows separate portions of a memory array subjected to a testing operation.

FIG. 8 schematically shows separate portions (four of which are depicted) of a memory array subjected to a testing operation. The four separate portions may be independently tested and assigned a different starting ECC protection level after testing. In this way, during testing (sort), reset ECC level protection can be allocated depending on the physical characteristics of the die (e.g., silicon quality). For example, portion (0,0) may be assigned a starting ECC protection level Lvl 0 (that may correspond to a minimum ECC correction capability, for example ECC1); portion (0,y) may be assigned a starting ECC protection level Lvl 1 (that may correspond to an intermediate ECC correction capability, for example ECC2); portion (x,0) may be assigned a starting ECC protection level Lvl 0 (e.g., ECC1); and portion (x, y) may be assigned a starting ECC protection level Lvl 3 (that may correspond to a maximum ECC correction capability, for example ECC4). Other portions (not shown) may be assigned respective starting ECC protection levels. Then, during die life, the ECC correction capability may be assigned and varied for example as shown above with reference to FIGS. 6A-6B and 7.

Alternatively or additionally, according to other embodiments of the present disclosure, the number of parity cells to be used for defining the ECC correction capability is selected by the user.

The ECC protection level may also be selected based on signals of sensors coupled to the memory array, such as sensors included in sensing unit 108. In other words, still referencing to FIG. 1, the memory device comprises one or more sensors in the sensing unit 108 which are coupled to the memory section 101 and to the controller 102. The controller 102 may thus be configured to select the number of parity cells to be used for defining the ECC correction capability based on the signals from the sensing unit 108.

Moreover, according to another embodiment, the number of parity cells apt to be used for defining the ECC correction capability is selected based on sense amplifier margin measurement. In other words, the controller may be configured to select the protection level by using sense amplifiers, such as sense amplifiers of circuit portion 105 of FIG. 1.

In this embodiment, the protection level decision based on sensing with multiple reference ensures to precisely establish when the margin is getting too small. This approach can be adopted instead of error frequency detection. In this case, the flow diagram of FIG. 7 is substantially the same but the reset value of the ECC protection level can be no ECC instead of ECC1. In fact, since sense amplifiers can anticipate margin loss, the average ECC protection level can be reduced.

As mentioned before, the memory device can integrate a dedicated hardware, e.g. integrated in the ECC unit 104 of FIG. 1, to properly assign the ECC protection level to each portion of the array.

Summing up, changing the ECC protection level is based on several trigger events, such as internal sensors, conditions, detectors, special markets, process quality, counters, depending on the specific circumstance. For instance, special markets (such as automotive, space, etc.) may require a higher ECC protection.

The ECC unit is therefore programmed to ensure a tradeoff between simplicity and defectivity matching. FIGS. 9A and 9B show schematic exemplary graphs of the cost of the implemented ECC selection algorithm versus aging of the cells of the array. It should be noted that, despite aging is represented on the X-axis, the concepts here disclosed are not limited to cost evolution vs. aging and, rather, they apply to whichever factor that may potentially affect the Bit Error Rate of the memory cells (e.g., lapsing time, cycling, endurance, exposure to high/low temperatures, hard/soft failure mechanisms, voltage drift, etc.; accordingly aging is only one of many possible examples and the figures should be correspondingly broadly interpreted). As seen for FIGS. 4A and 4B, it is assumed that the defect density (and therefore the required ECC correction power) increases with aging, even if different situations may occur.

More in particular, with reference to FIG. 9A, line 901' represents an estimated defectivity trend of the cells (based on a linear defectivity increase with aging, or other parameter), while steps 902' represent the cost trend in terms of occupied area obtained by using a lifetime-based technique for selecting the ECC protection level (e.g., by counting the number of accesses, as generally depicted in FIGS. 6A and 6B). Such an algorithm is thus based an estimated defectivity trend (e.g., the estimated defectivity trend may be obtained by defining a threshold of number access or generally of lifetime events for switching ECC protection level). On the other hand, line 903' represents the real defectivity trend of the memory and line 904' represents the cost of an ECC technique as based on an actual measurement and not only on the estimate thereof (e.g., based on error frequency and/or sense amplifier margin measurements or the like). The operation is thus optimized if the technique used to select the ECC protection level is defectivity-based, which better adapts to the real trend.

With reference to FIG. 9B, lines 901", 902", 903" and 904" corresponds to lines 901', 902', 903' and 904' of FIG. 9A, respectively. However, in this case, at graph portion 905", the real defectivity trend is even worse than expected by the estimated linear scenario, so that a lifetime-based technique would yield a wrong operation of the memory, while a defectivity-based technique is able to follow the real defectivity trend with better average performances in terms of costs.

In other words, the ECC protection level is thus optimized if the algorithm used to program the controller and deciding the proper level is defectivity based and the defectivity trend is better than expected. The average cost in term of area/power/time is in fact reduced, as shown in FIG. 9A. Moreover, the ECC protection level can be too low if the defectivity is worse than expected, as shown in FIG. 9B, so that an adaptive algorithm (e.g. a technique based on error frequency, sense amplifier margin measurements etc.) optimizes the ECC protection level to the actual defectivity and improves reliability. Therefore, a proper protection level algorithm reduces average cost and improves reliability.

Depending on the particular application, a mix of some or even all the disclosed criteria to select the number of parity cells to be used may be chosen. For example, sensing with margin measurement may also be associated with error frequency measurement.

In conclusion, the present disclosure provides a selectable ECC correction capability of a plurality of memory cells by taking into account the evolution of characteristics of the array, instead of forcing the use of the maximum protection (i.e., instead of basing the ECC on end-of-life reliability which always uses the highest ECC protection level and uses all the memory cells dedicated to parity). Advantageously, lowering the ECC protection level (e.g. when the BER is correspondingly low) allows to reduce the number of used memory cells associated with the parity and thus to reduce power consumption.

The ECC correction capability is thus variable over the lifetime of the array based on the time-varying status thereof, so that the ECC protection is adapted to the memory cells health. According to embodiments of the present disclosure, the ECC protection level is adapted to the protection needs of specific portions of the array, which are independently managed. Portion dimensions may vary from the ECC codeword up to the die. In fact, a portion may correspond to an internal subdivision like a bank group, a bank, a section or whatever other internal subdivision, or may correspond to a specification/host subdivision like a buffer, a page, or may correspond to other beneficial dimensions. In any case, the smaller the portion, the higher the benefits in terms of power consumption.

Unused cells may be sensed/written or not. More in particular, according to the present disclosure, unused cells are not sensed nor written, thus reducing power consumption. The resulting error probability is automatically lower since those unused cells do not participate to the Codeword Error Rate (CWER). Unused cells remain fresh for a longer time, degrade less than the others and concur to the CWER to a reduced extent when they are used. When those previously unused cells are then used, they maintain a higher reliability and a lower BER.

The ECC protection level is thus increased only when necessary, and the corresponding ECC hardware can be switched off.

The triggering events for switching the ECC protection level may be several and are not limited to a particular technique, which may vary with the memory technology.

According to an exemplary embodiment, a method for operating an array of memory cells comprises the steps of storing user data in a plurality of memory cells of the memory array, storing parity data associated with the user data in parity cells of the memory array, wherein a number of used parity cells is selected based on a status of the plurality of memory cells and is related to a corresponding selected ECC correction capability, and performing an ECC operation on the plurality of memory cells. In some examples, the number of used parity cells is selected between a defined minimum number and a defined maximum number. The ECC correction capability of this ECC operation may be based on the selected number of used parity cells or vice-versa, e.g., the selected number of parity cells used may be based on the ECC correction capability.

According to an embodiment, the present disclosure also relates to a method for selecting the ECC protection level of a codeword stored in an array of memory cells, the method comprising storing encoded user data in a plurality of memory cells of the memory array, incrementing a value of a counter associated with at least one portion of the memory array each time an event occurs, based on the value of the counter, selecting a number of parity cells associated with the codeword (e.g. stored in a portion of the memory array), the number of selected parity cells being related to a corresponding ECC correction capability, and storing parity data in the selected parity cells. All the features of the disclosure can be applied also to this exemplary method.

If not explicitly indicated, method steps are not necessarily in the disclosed sequence.

The present disclosure also relates to a memory device comprising an array including a plurality of memory cells and a controller configured to store user data in a plurality of memory cells of the memory array, to define a maximum number of parity cells for storing parity data, the maximum number of parity cells corresponding to a ECC correction capability (or correction power or protection level), to select, among the maximum number of parity cells, a number of parity cells to be actually used for storing the parity data, for example based on a current status of the memory cells storing the user data (e.g. the cells storing payload of a codeword), and to vary the number of used parity cells according to a variation of the status of the memory cells of the array. The number of selected and used parity cells may correspond to a selected ECC correction capability, and vice-versa. The number of used parity cells is comprised between a minimum number corresponding to a minimum ECC correction capability and the maximum number. The variable ECC correction capability is provided by an ECC engine that may be operated, using the corresponding number of selected parity bits, in one of several protection level modes.

The present disclosure also discloses a memory device comprising an array including a plurality of memory cells and an operating unit of the array, wherein the operating unit is configured to store user data in a plurality of memory cells of the memory array, store parity data associated with the user data in parity cells of the memory array, wherein a number of used parity cells is selected, for example, based on a status of the plurality of memory cells and is related to a corresponding ECC correction capability (or correction power or protection level), and perform an ECC operation on the plurality of memory cells, the ECC correction capability being based on the selected number of used parity cells.

All the features disclosed above may be applied also to these exemplary memory devices.

A related system, comprising a host device and a memory device as above is also disclosed, the system comprising for example any of a display communicatively coupled to the memory device or to the host, a network interface communicatively coupled to the memory device or to the host, and a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause-and-effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for operating an array of memory cells, the method comprising:
storing user data in a plurality of memory cells of the memory array;
storing parity data associated with the user data in parity cells of the memory array, wherein a number of used parity cells is selected based on a status of the memory cells and is related to a selected Error Correction Code (ECC) correction capability; and
based on the selected number of used parity cells, performing an ECC operation on the plurality of memory cells; and
writing and/or sensing only the memory cells used to store the user data and the selected parity cells used to store the parity data, wherein the used parity cells are selected between a maximum number and a minimum number and a number of unused parity cells is a difference between the maximum number and the number of used parity cells, and wherein the unused parity cells are not written nor sensed.

2. The method of claim 1, comprising storing data information relating to the selected ECC correction capability in at least one dedicated non-volatile region of the memory array.

3. The method of claim 1, comprising grouping the memory cells of the array into a plurality of portions, each portion of the plurality of portions being assigned a specific ECC correction capability based on the status of the memory cells thereof.

4. The method of claim 3, wherein a portion of the plurality of portions corresponds to one of a codeword, a bank, a bank group, a section of the array, the entire array, a buffer, a page.

5. The method of claim 3, comprising storing respective data information relating to the selected ECC correction capability for each portion of the plurality of portions, the method further comprising storing in a look-up table said data information, wherein, in said look-up table, each portion of the array is associated with its respective selected ECC correction capability.

6. The method of claim 1, wherein a codeword is encoded with additional information bits associated thereto and relating to the selected ECC correction capability for said codeword.

7. The method of claim 1, comprising varying the selected ECC correction capability based on a variation of the status of the memory cells.

8. The method of claim 1, wherein the number of parity cells to be used for defining the selected ECC correction capability is selected based on a value of a first counter used to count at least one of a number of accesses to the memory cells or a number of refresh events or a number of power-up events or a combination thereof, the value of the first counter indicating the status of the memory cells.

9. The method of claim 1, wherein the number of parity cells to be used for defining the selected ECC correction capability is selected based a counted error frequency.

10. The method of claim 1, comprising:
testing the quality of at least one portion of the memory array by means of a testing machine; and
assigning to said at least one portion a proper number of parity cells to be used for defining the selected ECC correction capability based on the performed quality test.

11. The method of claim 1, wherein the number of parity cells to be used for defining the ECC correction capability is selected by the user or is based on signals of sensors coupled to the memory array.

12. The method of claim 1, wherein the number of parity cells to be used for defining the selected ECC correction capability is selected based on sense amplifier margin measurement.

13. A memory device comprising:
an array including a plurality of memory cells; and
an operating unit of the array, wherein the operating unit is configured to:
store user data in a plurality of memory cells of the memory array;
store parity data associated with the user data in parity cells of the memory array, wherein a number of used parity cells is selected based on a status of the plurality of memory cells and is related to a corresponding Error Correction Code (ECC) correction capability;
based on the selected number of used parity cells, perform an ECC operation on the plurality of memory cells; and
write and/or sense only the memory cells used to store the user data and the selected parity cells used to store the parity data, wherein the used parity cells are selected between a maximum number and a minimum number and a number of unused parity cells is a difference between the maximum number and the number of used parity cells, and wherein the unused parity cells are not written nor sensed.

14. The memory device of claim 13, wherein the operating unit is configured to store data information relating to the selected ECC correction capability in at least one dedicated non-volatile region of the memory array.

15. The memory device of claim 13, wherein the operating unit is configured to group the memory cells of the array into a plurality of portions, each portion of the plurality of portions being assigned a specific ECC correction capability based on the status of the memory cells thereof.

16. The memory device of claim 15, wherein a portion of the plurality of portions corresponds to one of a codeword, a bank, a bank group, a section of the array, the entire array, a buffer, a page.

17. The memory device of claim 15, wherein the operating unit is configured to:
   store respective data information relating to the selected ECC correction capability for each portion of the plurality of portions; and
   store in a look-up table said data information, wherein, in said look-up table, each portion of the array is associated with its respective selected ECC correction capability.

18. The memory device of claim 13, wherein a codeword is encoded with additional information bits associated thereto and relating to the selected ECC correction capability for said codeword.

19. The memory device of claim 13, wherein the operating unit is configured to vary the selected ECC correction capability based on a variation of the status of the memory cells.

20. The memory device of claim 13, wherein the number of parity cells to be used for defining the selected ECC correction capability is selected based on a value of a first counter used to count at least one of a number of accesses to the memory cells or a number of refresh events or a number of power-up events or a combination thereof, the value of the first counter indicating the status of the memory cells.

21. The memory device of claim 13, wherein the number of parity cells to be used for defining the selected ECC correction capability is selected based a counted error frequency.

22. The memory device of claim 13, wherein the operating unit is configured to:
   test the quality of at least one portion of the memory array by means of a testing machine; and
   assign to said at least one portion a proper number of parity cells to be used for defining the selected ECC correction capability based on the performed quality test.

23. The memory device of claim 13, wherein the number of parity cells to be used for defining the ECC correction capability is selected by the user or is based on signals of sensors coupled to the memory array.

24. The memory device of claim 13, wherein the number of parity cells to be used for defining the selected ECC correction capability is selected based on sense amplifier margin measurement.

* * * * *